United States Patent [19]
Takada et al.

[11] Patent Number: 6,007,878
[45] Date of Patent: *Dec. 28, 1999

[54] PROCESS FOR PRODUCING AN OPTICAL RECORDING MEDIUM HAVING A PROTECTIVE LAYER FORMED USING A PLASMA PROCESSING DEVICE

[75] Inventors: Kunio Takada; Nobumasa Suzuki, both of Yokohama; Toshimori Miyakoshi, Kawasaki, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/635,546

[22] Filed: Apr. 22, 1996

Related U.S. Application Data

[63] Continuation of application No. 08/250,681, May 26, 1994, abandoned.

[30] Foreign Application Priority Data

May 27, 1993  [JP]  Japan ..................................... 5-126275

[51] Int. Cl.[6] ................. H05H 1/02; H05H 1/24
[52] U.S. Cl. .................. 427/562; 427/563; 427/564; 427/575; 427/576; 427/578; 427/579
[58] Field of Search ..................................... 427/571, 575, 427/562, 563, 564, 578, 579, 131, 132, 162; 118/723 MW, 723 ME, 723 MR, 723 MA, 723 AN

[56] References Cited

U.S. PATENT DOCUMENTS

| | | | |
|---|---|---|---|
| 4,745,337 | 5/1988 | Pichot et al. | 427/575 |
| 4,892,692 | 1/1990 | Takada et al. | 264/106 |
| 4,971,832 | 11/1990 | Arai et al. | 427/575 |
| 4,996,077 | 2/1991 | Moslehi et al. | 427/571 |
| 5,017,404 | 5/1991 | Paquet et al. | 427/575 |
| 5,188,862 | 2/1993 | Itatani et al. | 427/575 |
| 5,203,960 | 4/1993 | Dandle | 427/571 |
| 5,370,765 | 12/1994 | Dandle | 427/571 |
| 5,487,875 | 1/1996 | Suzuki | 422/186.05 |

FOREIGN PATENT DOCUMENTS

| | | | |
|---|---|---|---|
| 0337445 | 10/1989 | European Pat. Off. . | |
| 36-3007375 | 1/1988 | Japan | 427/575 |
| 1223644 | 9/1989 | Japan . | |
| 401222056 | 9/1989 | Japan | 427/575 |
| 2-15929 | 4/1990 | Japan . | |
| 3-66043 | 3/1991 | Japan . | |
| 3-69033 | 3/1991 | Japan . | |
| 3066043 | 3/1991 | Japan . | |
| 4-30343 | 2/1992 | Japan . | |
| 5-345982 | 12/1993 | Japan | 427/575 |

OTHER PUBLICATIONS

Patent Abtracts of Japan, vol. 15, No. 226 (P–1213) with respect to Japanese Patent Document No. 03–066043 (Jun. 10, 1991).

Derwent Abstract (WPI) No. 89–303909 with respect to Japanese Patent Document No. 01–223644 (Sep. 6, 1989).

*Primary Examiner*—Marianne Padgett
*Attorney, Agent, or Firm*—Fitzpatrick, Cella, Harper & Scinto

[57] ABSTRACT

A process for producing an optical recording medium is disclosed which has a substrate and a recording film and an inorganic dielectric film, which are superposed on said substrate. The inorganic dielectric film is formed using a plasma processing device including a microwave guide means provided with an endless ring waveguide.

19 Claims, 9 Drawing Sheets

PROCESS FOR PRODUCING AN OPTICAL RECORDING MEDIUM HAVING A PROTECTIVE LAYER FORMED USING A PLASMA PROCESSING DEVICE

This application is a continuation of application Ser. No. 08/250,681, filed May 26, 1994, now abandoned.

BACKGROUND OF THE INVENTION

1. Field of the Invention

This invention relates to an optical recording medium and a process for its production. More particularly, it relates to an optical recording medium comprising a substrate and an inorganic dielectric film formed thereon, and a process for its production.

2. Related Background Art

In recent years, there is an increasing demand for recording media having a large recording capacity and enabling a high-speed data transfer for use as computer memories and image information memories. As recording media that can answer such a demand, optical recording media for recording and reproducing information by the use of laser light as exemplified by magneto-optical recording media and phase change recording media are energetically being developed.

More specifically, the magneto-optical recording media have a system in which information is recorded and reproduced by utilizing the characteristic that the polarization plane of laser light being reflected has a rotational direction which differs depending on the direction of magnetization when the polarized laser light is shed on the surface of a recording layer containing a magnetic material (i.e., the magnetic Kerr effect).

As for the phase change recording media, they have a system in which information is recorded and reproduced by utilizing the reversible phase transformation between an amorphous state and a crystalline state, caused when, for example, laser light is shed on a recording layer containing Te, and different optical properties are shown in the respective states.

These optical recording media employ such layer configuration that in order to obtain reproducing signals having a greater C/N ratio, for example, an inorganic dielectric film is provided between a recording film and a substrate so that the reproducing signals can be amplified utilizing an optical interference effect (i.e., the enhancement effect), or, as shown in FIG. 4A, a recording film 401 is held between inorganic dielectric films 402 and 403 so that the reproducing light can be amplified and, at the same time, they can serve as protective films of the recording film 401. Another configuration is also known in which, as shown in FIG. 4B, a reflective layer 404 is additionally provided on the inorganic dielectric film 403 in order to improve the interference effect.

To form such inorganic dielectric films, thin films of, for example, $Si_3N_4$, SiC, SiO, amorphous Si (a-Si), AlN, $Al_2O_3$, $TiO_2$, $Ta_2O_5$ and ZnS have been conventionally used.

Performances as exemplified by C/N ratios of reproducing signals and stability with the passage of time of recording films of the magneto-optical recording media and phase change optical recording media making use of such inorganic dielectric films greatly depend not only on the properties of recording films as previously stated, but also on the properties of the inorganic dielectric films. Accordingly, in domestic and foreign research institutions, research and development are energetically pursued on materials and production processes for dielectrics having a great enhancement effect on reproducing signals and a superior protective performance on recording layers so that the optical recording media can be made to have a higher performance. For example, it is attempted to form inorganic dielectric films for optical recording media by forming AlN or SiN by reactive sputtering carried out in an atmosphere of $N_2$ using an Al target or Si target as disclosed in Japanese Patent Publication No. 2-15929, or by ECR plasma-assisted CVD as disclosed in Japanese Patent Application Laid-open Nos. 3-66043, 3-69033 and 4-30343.

In recent years, however, in the trend toward the lower-cost production of optical recording media, it is sought to improve the film forming rate for the formation of inorganic dielectric films.

Under such circumstances, in the above film forming processes for the inorganic dielectric films, the reactive sputtering must be greatly improved in the power to be applied to the target, in order to improve the film deposition rate. In such a case, however, abnormal discharge onto the target tends to occur because of the concentration of charges on the target, and hence it has been difficult to stably form high-quality inorganic dielectric films for optical recording media. On the other hand, the plasma-assisted CVD makes it possible to form films at a higher rate than the reactive sputtering. The former, however, has its own limit in the film formation rate in order to form inorganic dielectric films with good enhancement effect and recording layer protective performance without causing inclusion of a stress that may cause a deformation of optical recording media, and has been unsatisfactory for achieving the lower-cost production of optical recording media.

Moreover, in the conventional plasma-assisted CVD, a uniform plasma density can only be attained in a limited region inside a reaction chamber, and it becomes necessary to make a film forming apparatus larger when uniform inorganic dielectric films are simultaneously formed on a plurality of substrates, where it has been not easy to achieve the low-cost production of optical recording media when the plasma-assisted CVD is used.

SUMMARY OF THE INVENTION

The present invention was made taking account of the problems discussed above. A main object of the present invention is to provide a process for producing at a low cost an optical recording medium that can stably maintain the C/N carrier-to-noise ratio of reproducing signals at a high level while preventing deformation such as warpage or deflection.

Another object of the present invention is to provide an optical recording medium that can enjoy less deformation such as warpage or deflection, can achieve a high C/N ratio of reproducing signals and also can have a recording layer promising a superior stability with the passage of time.

The present inventors made extensive studies in order to achieve the above objects. As a result, they have discovered that an inorganic dielectric film having superior enhancement effect and recording layer protective performance and having a low internal stress and a high quality can be formed at a high rate and also in a film thickness uniform over a large area can be obtained when formed using a microwave plasma processing device so constructed that microwaves are guided into a plasma chamber through a microwave guide means having an endless ring waveguide. They have thus accomplished the present invention.

The process for producing an optical recording medium according to the present invention is a process for producing an optical recording medium including a substrate, and a recording film and an inorganic dielectric film, both being superposed on the substrate, wherein said inorganic dielectric film is formed using a plasma processing device having a microwave guide means provided with an endless ring waveguide.

The process for producing an optical recording medium according to the present invention is also a process for producing an optical recording medium comprising including a substrate, and a recording film and an inorganic dielectric, both being superposed on the substrate, the process including the steps of forming the recording film on the substrate, and forming the inorganic dielectric film on the substrate by microwave plasma-assisted CVD;

the microwave plasma-assisted CVD being carried out using a microwave plasma processing device including a plasma chamber and an endless ring waveguide provided in such a manner that it surrounds the plasma chamber and has a plurality of slots through which microwaves are guided into the plasma chamber.

The optical recording medium according to the present invention includes a substrate, and a recording film and an inorganic dielectric, both being superposed on the substrate, film, wherein said inorganic dielectric film is formed using a plasma processing device comprising a microwave guide means provided with an endless ring waveguide.

BRIEF DESCRIPTION OF THE DRAWINGS

FIGS. 2A and 2B are schematic illustrations of a film forming device for forming inorganic dielectric films of optical recording media according to the present invention, in which FIG. 2A is a schematic perspective illustration of the inorganic dielectric film forming device, and FIG. 2B is a schematic cross section of the film forming device shown in FIG. 2A.

FIGS. 3A and 3B are schematic illustrations of an endless ring waveguide of the film forming device shown in FIGS. 2A and 2B, in which FIG. 3A is a schematic perspective illustration of the endless ring waveguide of the film forming device shown in FIGS. 2A and 2B, and FIG. 3B is a cross section along the line A—A in FIG. 3A.

FIGS. 6A to 6C illustrate another embodiment of the film forming device for forming inorganic dielectric films of optical recording media according to the present invention, in which FIG. 6A is a schematic perspective view of the film forming device for forming inorganic dielectric films of optical recording media according to the present invention, constructed in a rectangular shape, FIG. 6B is a cross section along the line B—B in FIG. 6A, and FIG. 6C is a cross section along the line C—C in FIG. 6A.

FIGS. 7A and 7B illustrate another embodiment of the film forming device for forming inorganic dielectric films of optical recording media according to the present invention, in which FIG. 7A is a schematic perspective view of the film forming device for forming inorganic dielectric films of optical recording media according to the present invention, constructed in a rectangular shape, and FIG. 7B is a cross section along the line D—D in FIG. 7A.

DETAILED DESCRIPTION OF THE PREFERRED EMBODIMENTS

The present invention will be described below with reference to the accompanying drawings.

Figure 1:
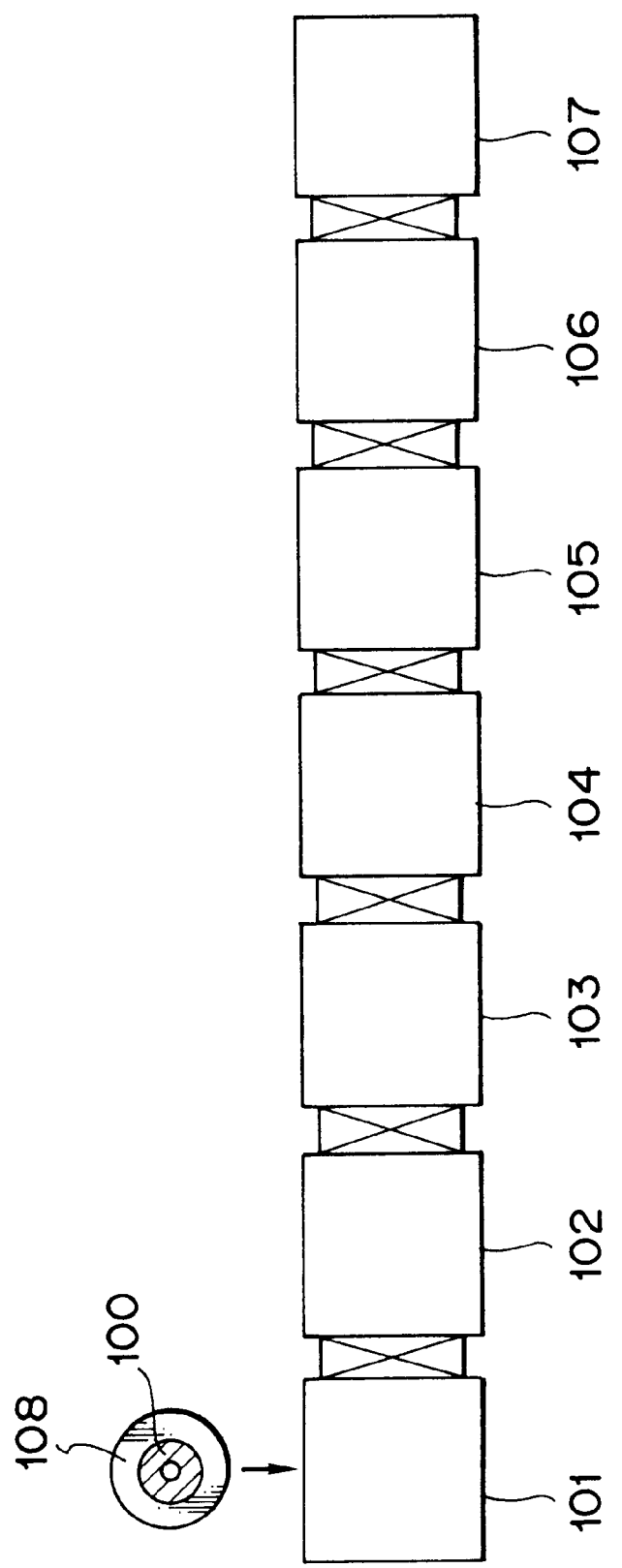
FIG. 1 is a schematic illustration of an apparatus for producing an optical recording medium according to the present invention.
Figure 4A:
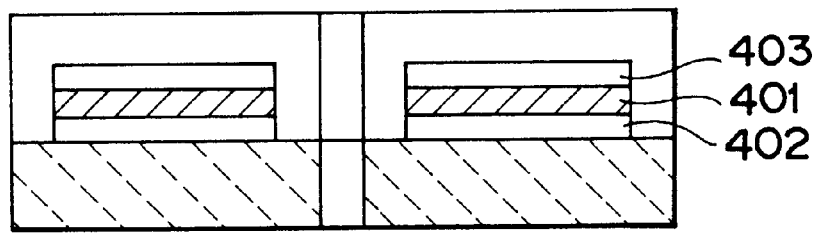
FIGS. 4A and 4B are schematic cross sections of optical recording media.
Figure 4B:
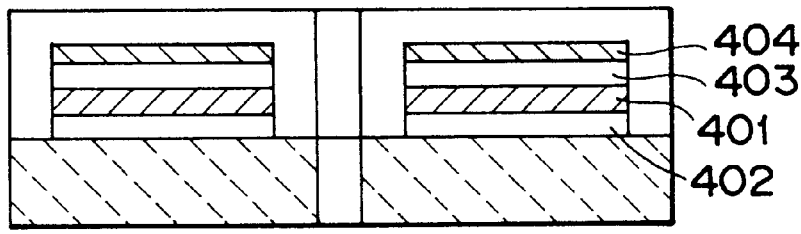

FIG. 1 is a schematic plan view of an in-line type continuous film forming apparatus for forming inorganic dielectric films and a recording film according to the present invention, applied to an embodiment of the process for producing the optical recording medium as shown in FIG. 4B. In FIG. 1, reference numeral 101 denotes a chamber into which a substrate 100 is fed; 102, a degassing chamber; 103 and 105, film forming chambers in which inorganic dielectric films 402 and 403 are formed; 104, a film forming chamber in which a recording film 401 as exemplified by a magneto-optical recording film is formed; and 106, a film forming chamber in which a reflective film is formed. Reference numeral 107 denotes a chamber from which a substrate with the recording film 401 and inorganic dielectric films 402 and 403 formed thereon are taken out. Doors (not shown) that can be opened or closed are also provided between the respective chambers, and a substrate holder 108 for carrying the substrate 100 is set to be movable from the substrate feeding chamber 101 to the substrate takeout chamber 107 in order.

The optical recording medium substrate 100 is transported from the substrate feeding chamber 101 toward the substrate takeout chamber 107, in the course of which the degassing of the substrate 100, the formation of the inorganic dielectric film 402, the formation of the recording film 401, the formation of the inorganic dielectric film 403 and the formation of the reflective layer 404 are carried out in order, so that an optical recording medium is formed which comprises the substrate provided thereon with the recording film 401, the inorganic dielectric films 402 and 403 and the reflective layer 404.

In this embodiment, the film forming chambers 103 and 105 are each constituted of a microwave plasma-assisted CVD film forming device comprising a microwave guide means having an endless ring waveguide. Then, FIG. 2A is a schematic perspective view of such a microwave plasma-assisted CVD film forming device of which the film forming chamber 103 (or 105) is constituted, and FIG. 2B is a schematic cross-sectional view of the CVD device in the direction falling at right angles to the direction in which the substrate is transported.

Figure 2A:
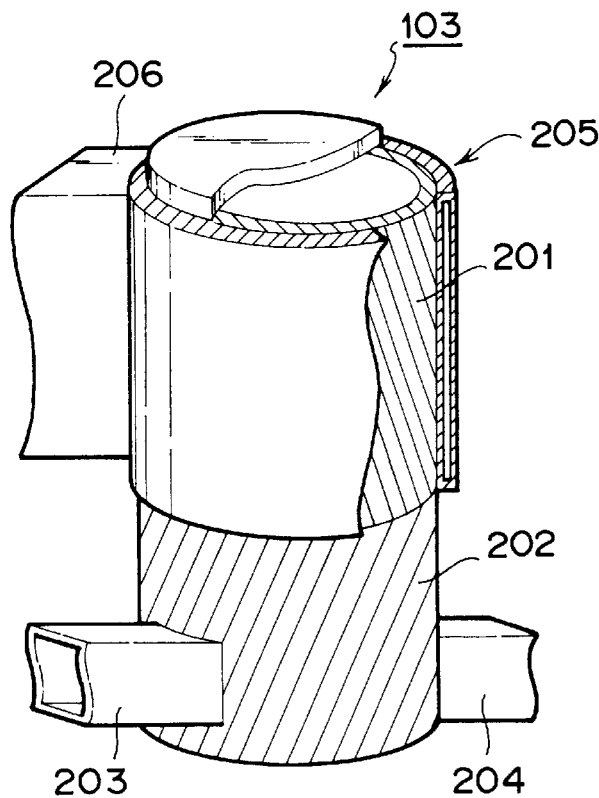
Figure 2B:
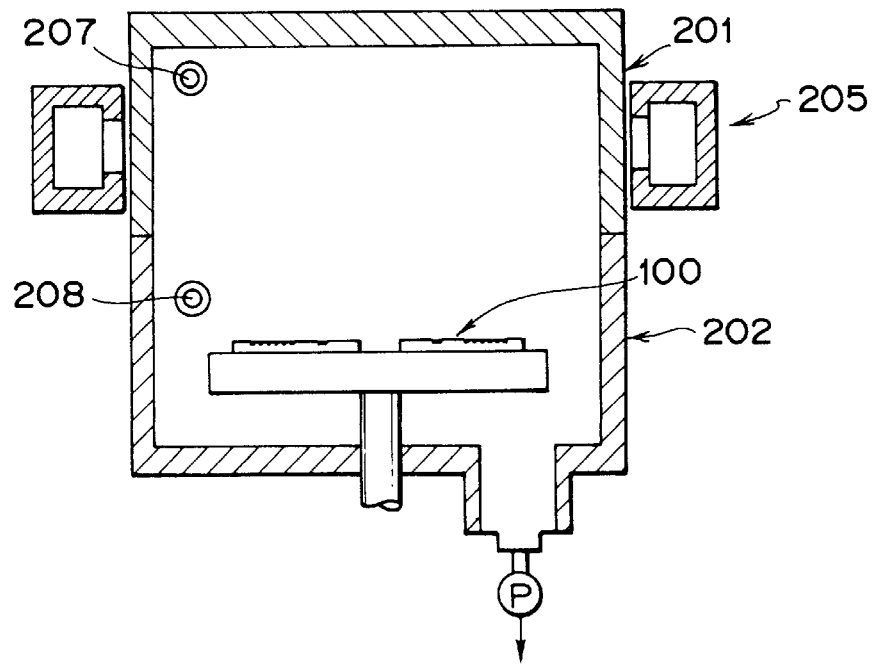

In the aforesaid FIGS. 2A and 2B, reference numeral 201 denotes a plasma chamber; 202, a film forming chamber; 203, a substrate transport path extending from the degassing chamber 102 to the inorganic dielectric film forming chamber 103; and 204, a substrate transport path extending from the film forming chamber 103 to the recording film forming chamber 104. Reference numeral 205 denotes an endless ring waveguide provided along the periphery of the plasma chamber; 206, a microwave introducing portion through which microwaves are introduced into the endless ring waveguide 205; and 207 and 208, gas feeding means through which gases are fed into the plasma chamber 201 and the film forming chamber 202.

Figure 3A:
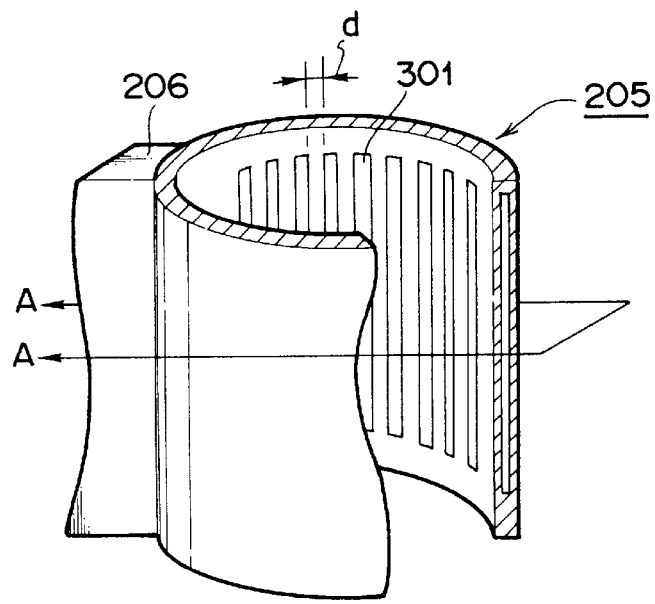
Figure 3B:
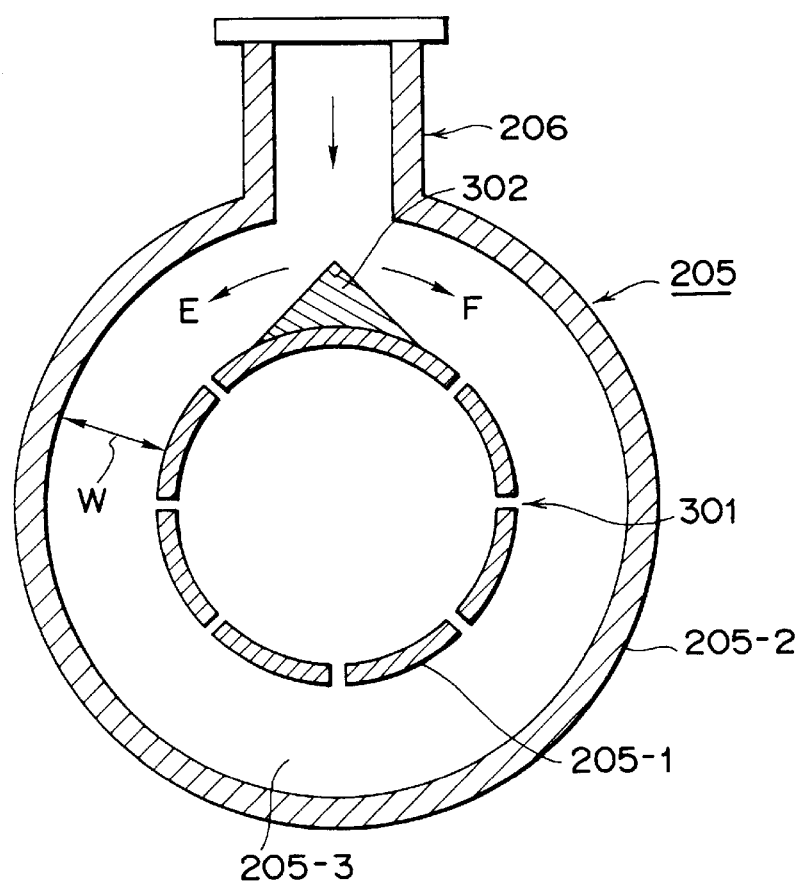

FIG. 3A is a schematic perspective view of the microwave guide means used in the plasma-assisted CVD device shown in FIGS. 2A and 2B, and FIG. 3B is a cross section along the line A—A in FIG. 3A. In FIG. 3A, reference numerals 205 and 206 denote the endless ring waveguide and the microwave introducing portion, respectively, as described above. To the microwave introducing portion 206, microwave generating means as exemplified by a tuner, a directional coupler, an isolator and a microwave power source are connected.

The endless ring waveguide 205 used in the present invention has an inner wall 205-1 and an outer wall 205-2, which are so constructed that they form a given empty space 205-3. The inner wall of the endless ring waveguide is provided with slots 301 through which microwaves are guided into the plasma chamber.

When, for example, $SiN_x$ films are formed using the plasma-assisted CVD device thus constructed, the insides of the plasma chamber 201 and film forming chamber 202 are evacuated by means of a vacuum pump. Thereafter, $N_2$ gas as a reaction gas is fed into the plasma chamber 201 from the gas feeding means 207 and also $SiH_4$ gas as a starting material gas is fed in the film forming chamber 202, in the course of which microwaves are introduced into the endless ring waveguide from the microwave introducing portion 206 and the microwaves are guided into the plasma chamber 201 from the slots made in the inner wall of the endless ring waveguide. Thus, a plasma originating mainly from the $N_2$ gas can be generated in the plasma chamber 201 and the $SiH_4$ gas is ionized in the film forming chamber by the action of the energy of the plasma, so that the $SiN_x$ film can be formed on the substrate.

Figure 5:
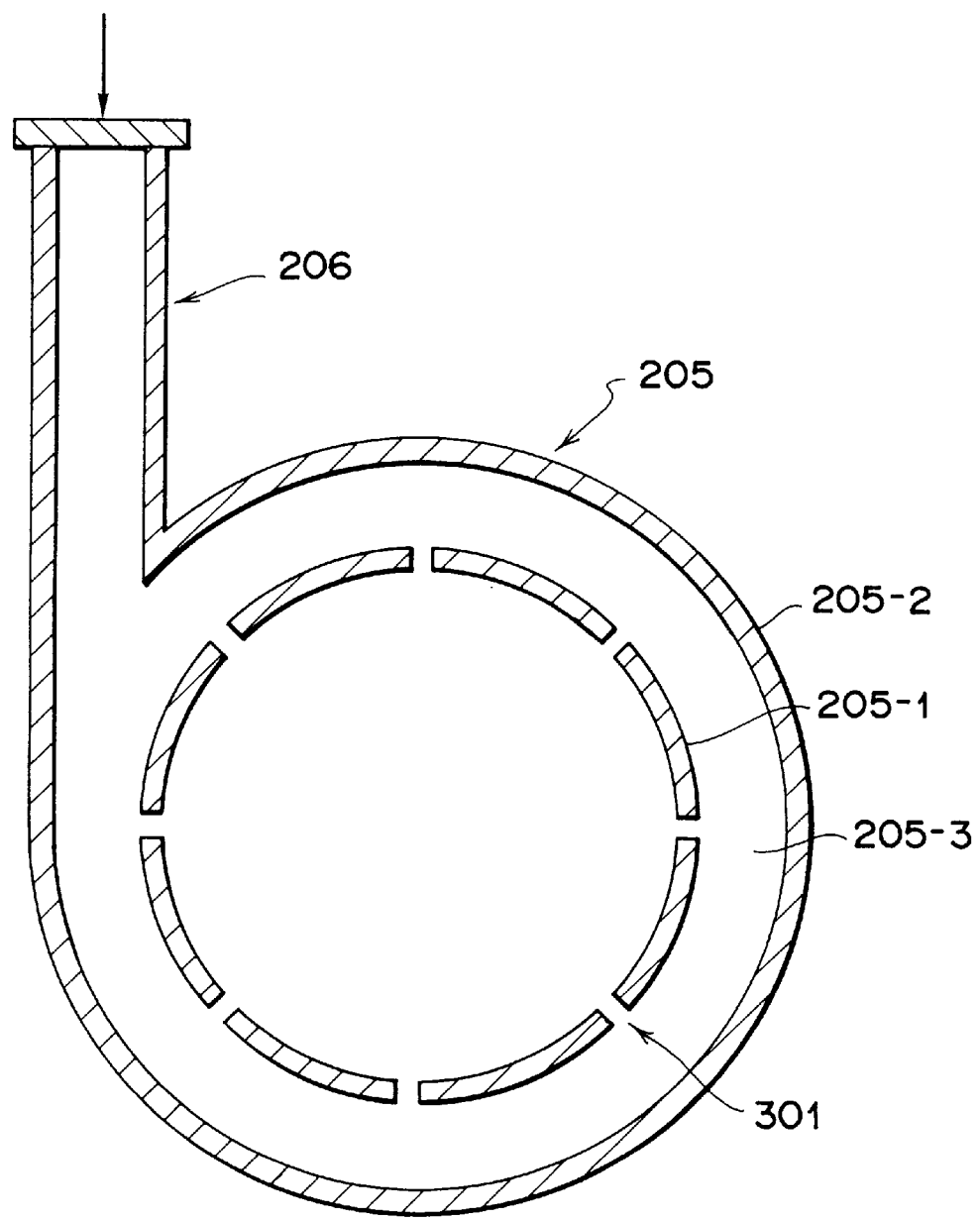
FIG. 5 is a schematic cross section of another embodiment of the endless ring waveguide usable in the present invention.

In the present invention, the microwave guide means may be constructed in the manner that, as shown in FIG. 3B, the ring waveguide 205 and the microwave introducing portion 206 are so provided that microwaves are introduced in the direction falling at right angles to the outer wall of the ring waveguide, or in the manner that, as shown in FIG. 5, microwaves are introduced in the direction tangential to the outer wall of the ring waveguide.

In combination with the embodiment in which, as shown in FIG. 3B, the ring waveguide 205 and the microwave introducing portion 206 are so provided that microwaves are introduced in the direction falling at right angles to the outer wall of the ring waveguide, the microwaves introduced into the ring waveguide from the microwave introducing portion may be divided two ways so that the microwaves are propagated in both directions (see arrows E and F in FIG. 3B) of the ring waveguide 205. In such a case, interference waves can be produced inside the ring waveguide by the mutual action of the microwaves thus divided, so that the intensity of microwaves that usually becomes lowest at the part opposing the microwave introducing portion can be compensated and hence the microwave can be uniformly guided into the plasma chamber, making it possible to form the inorganic dielectric films for optical recording media in a more uniform thickness and a higher quality.

The microwaves may be divided in two directions by a method in which, as shown in FIG. 3B, a dividing block 302 having the shape of a triangular pillar in its cross section and comprised of a microwave-reflective material (e.g., a metal) is placed on the inner wall 205-1 of the ring waveguide at a part against which the microwaves coming from the microwave introducing portion 206 collide, or a method in which the inner wall 205-1 itself of the microwave introducing portion has been molded in such a shape that it functions as the above dividing block.

In this method, the inorganic dielectric films formed can be more improved in their performance and uniformity when the dividing block has a shape of enabling equal division of microwaves, as exemplified by a dividing block provided on the inner wall 205-1 in such a manner that the cross-sectional shape of the triangular pillar is an isosceles triangle, the direction of a perpendicular line dropped toward the base of the triangle from the vertex held between the two equal sides thereof is in agreement with the direction in which the microwaves are introduced from the microwave introducing means, and also the vertex projects in the direction of the introduction of microwaves, or when an endless ring waveguide that functions in such a manner is used. In this embodiment, it is preferable for the triangle to have an angle of 90° at its vertex because such a shape makes it possible for the microwaves introduced into the ring waveguide 205 to undergo interference with good efficiency. It is also preferable in this embodiment to make the length of longer sides of the dividing block equal to the distance between the inner wall and the outer wall of the ring waveguide.

There are no particular limitations on the materials for the dividing block used herein, so long as they are capable of reflecting the microwaves, as stated above. For example, metals or the like can be used. A dividing block made of aluminum or glass coated with chromium or aluminum on its surface may be used when microwave reflection efficiency and durability are taken into account.

With regard to the distance (d) between the plurality of slots 301 made in the inner wall of the endless ring waveguide used in the present invention, there are no particular limitations thereon so long as microwaves capable of achieving a plasma density (e.g., $10^{11}$ particles/cm$^3$ or more, and particularly $10^{12}$ particles/cm$^3$ or more) high enough to form the inorganic dielectric film can be introduced. For example, when the endless ring waveguide is constructed to have the dividing block as described above, the distance (d) between the slots may preferably be set at ½ or its integer times (i.e. ½×n where n is an integer) of waveguide wavelength (wavelength of the microwaves propagated through the waveguide) so that the slots come in agreement with the "loop" of the interference waves generated in the endless ring waveguide. That is, such construction makes it possible to form high-quality inorganic dielectric films for optical recording media in a uniform state over a large area and is very effective for decreasing production cost of the optical recording media.

With regard to the shape of the slots 301 provided in the microwave guide means of the present invention, slots with any shape can be employed so long as the microwaves can be introduced through the slots, irrespective of whether they have longer sides parallel to or inclined toward the direction of the propagation of microwaves, or are not rectangular but either round or polygonal, or in the form of dumbbells or asters. However, taking account of efficient introduction of microwaves and readiness to control their leakage probability, the slots may preferably have such a shape that their longer sides are perpendicular to the direction of the propagation of a microwave. For example, rectangular slots of 40 mm to 60 mm×1 mm to 5 mm are most suitable.

With regard to the length (l) of each slot 301, it can also be a factor that defines the leakage probability and besides controls the density of the plasma generated inside the plasma chamber. Its value may be appropriately set so that the plasma density inside the plasma chamber may satisfy the above value, in accordance with the power of microwaves introduced through the microwave guide means, the state of the microwaves in the ring waveguide and also the position of the slots. Stated specifically, when the ratio of the waveguide peripheral length to the waveguide wavelength of the ring waveguide 205 is large, the microwaves may preferably be propagated in a larger wave number so that good microwaves can also be leaked from slots positioned opposite to the microwave introducing portion of the ring waveguide. For that purpose, it is preferred to make the length of each slot smaller to decrease the leakage probability. On the other hand, when the ratio of the waveguide peripheral length to the waveguide wavelength of the ring waveguide 205 is small, it is preferred to make the length of each slot larger to increase the leakage probability so that the microwaves may not leak in excess from the slots positioned opposite to the microwave introducing portion of the ring waveguide.

Stated more specifically, when the ratio of the waveguide peripheral length to the waveguide wavelength of the ring waveguide is 3 to 24, each slot may most preferably have a length of ¼ to ⅜ of the waveguide wavelength. This enables uniform formation of high-quality inorganic dielectric films for optical recording media over substantially the entire region of the film forming chamber, and is preferable for further decreasing the production cost of optical recording media.

Use of such a device according to the present embodiment also enables formation of substantially uniform and high-quality inorganic dielectric films for optical recording media in spite of the positioning of the substrates in the chamber, and hence the device can be particularly preferably used in the in-line type film forming apparatus for producing optical recording media as shown in FIG. 1.

In the present invention, there are no particular limitations on the materials for the endless ring waveguide. Its inner wall and outer wall may preferably be comprised of such materials that can prevent any propagation loss of microwaves, and any materials can be used so long as they have a sufficient mechanical strength and their surfaces are covered with a conductive layer to prevent penetration of microwaves, as exemplified by insulating materials including metals such as Cu, Al, Fe, Ni, alloys thereof, various types of glass, quartz, silicon nitride, alumina, acrylate, polycarbonate, polyvinyl chloride and polyimide whose surfaces are covered with a metal thin film of Al, W, Mo, Ti, Ta, Cu, Ag or the like. In particular, the ring waveguide may be made of stainless steel, and the inner surface of the waveguide may be coated with copper which is further coated with silver. Such constitution can be preferably used.

The endless ring waveguide used in the present invention may have a polygonal shape or other shape, depending on the shape of the plasma chamber. The empty space inside the ring waveguide may have any size and any shape in its cross section, including a circle, a semicircle and other shape, any of which can be used so long as the microwaves can be propagated. Its waveguide peripheral length may be about integer times the waveguide wavelength of the microwave, ranging from 3 to 24 times. This is preferable in order to make uniform the plasma introduced into the plasma chamber.

A magnet may also be provided on the inner wall of the endless ring waveguide at its surface on the side opposing to the plasma chamber so that a magnetic field is produced in the vicinity of, in particular, the inner wall of the chamber. This makes it possible to prevent inorganic dielectric films from adhering to the inner wall of the plasma chamber, and is preferable in order to improve film forming efficiency.

In the endless ring waveguide, any cooling means as shown in FIG. 3B by reference numeral 303 may also be preferably provided in order to prevent the inside of the waveguide from being oxidized when heated with microwaves. As this cooling means, for example, air cooling means or water cooling means can be used.

In the embodiment described above, the slots made in the inner wall of the ring waveguide are described as apertures made in the wall. They, however, are by no means limited to such an embodiment, and may be replaced with a constitution in which dielectric windows capable of transmitting microwaves are provided in the wall.

Figure 6A:
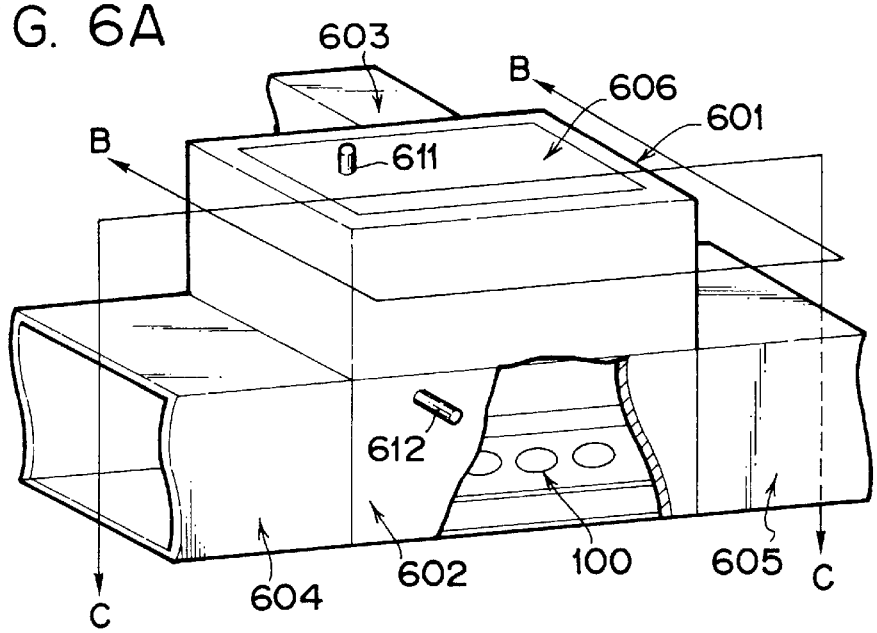

FIG. 6A is a schematic perspective view to show another embodiment of the plasma-assisted CVD device that can be used to form inorganic dielectric films in the process for producing the optical recording medium of the present invention. This embodiment is characterized by a plasma chamber made to have a rectangular shape and an endless ring waveguide provided around this plasma chamber.

In FIG. 6A, reference numeral 601 denotes an endless ring waveguide surrounding the plasma chamber; 602, a film forming chamber provided right beneath the plasma chamber; and 603, a microwave introducing portion from which microwaves are introduced into the microwave guide means. Reference numerals 604 and 605 denote paths through which, for example, disk substrates 100 are transported; 611, a means for feeding gas into the plasma chamber; and 612, a means for feeding gas into the film forming chamber.

Figure 6B:
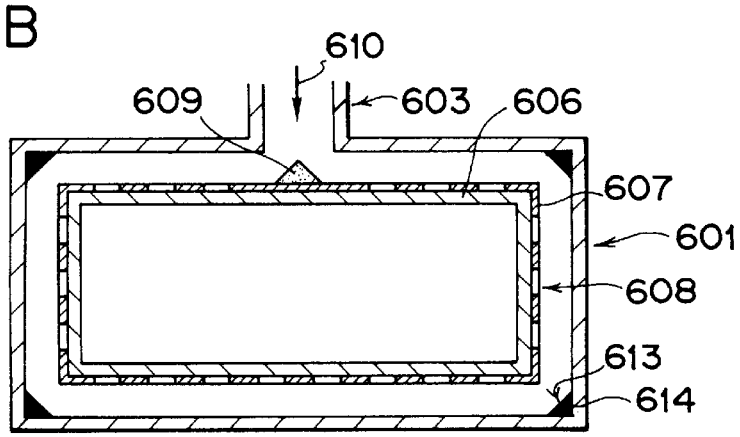
Figure 6C:
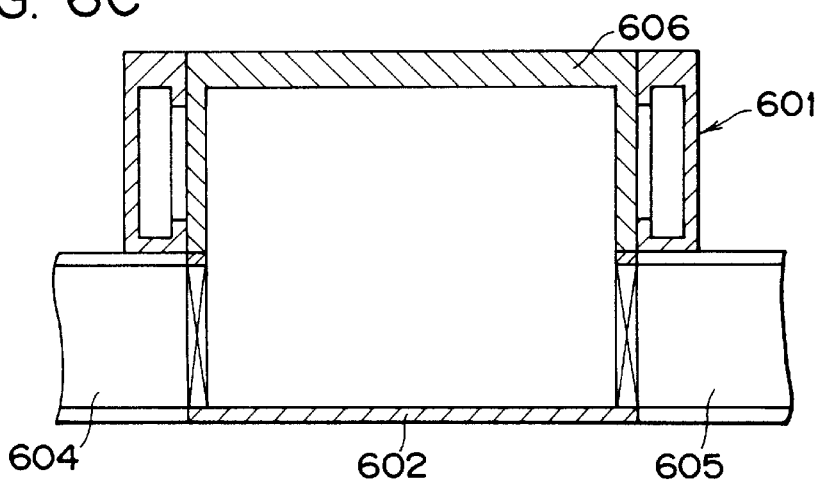

FIG. 6B is a cross section along the line B—B in FIG. 6A, and FIG. 6C is a cross section along the line C—C in FIG. 6A. In FIGS. 6B and 6C, reference numeral 606 denotes a plasma chamber made of, for example, quartz; 607, an inner wall of the endless ring waveguide, in which slots 608 are made at given intervals. Reference numeral 609 denotes a dividing block for dividing in both directions inside the endless ring waveguide the microwaves introduced from the microwave introducing portion 603 in the direction shown by an arrow 610.

Using the plasma-assisted CVD device constructed in this way, inorganic dielectric films can be formed in the same manner as previously described. That is, the insides of the plasma chamber and film forming chamber are evacuated to a vacuum of about $1 \times 10^{-4}$ Pa by means of a vacuum pump (not shown), and thereafter, gases are fed into the plasma chamber from gas feeding means 611 and 612 and adjusted to desired pressure, in the course of which microwaves with a desired power is introduced into the endless ring waveguide from a microwave power source. Even when such rectangular plasma chamber and film forming chamber are used, the employment of such an endless ring waveguide, in particular, the endless ring waveguide provided with the dividing block makes it possible to form high-quality inorganic dielectric films for optical recording media having uniform thickness on the respective substrates arranged in the film forming chamber. Hence, when films are simultaneously formed on a plurality of substrates, the plasma chamber and the film forming chamber may only be constructed in such a size that a plurality of substrates can be received, and thus the film forming efficiency can be improved.

In the case when the rectangular endless ring waveguide is used as described above, it is preferable to provide, as shown in FIG. 6B, reflective blocks 613 that can promote vertical reflection at right-angled corners 614 inside the ring waveguide to improve propagation efficiency of the microwaves. The reflective blocks 614 may be comprised of blocks each having a right-angled isosceles triangle in cross section and in which a length (k) of the longer side serving as a reflective surface is twice a width (w) between the outer wall and inner wall of the ring waveguide, and may be provided in the manner that their two equal sides come in contact with the right-angled corners 613, respectively. This is preferable from the viewpoint of an improvement in propagation efficiency.

Figure 7A:
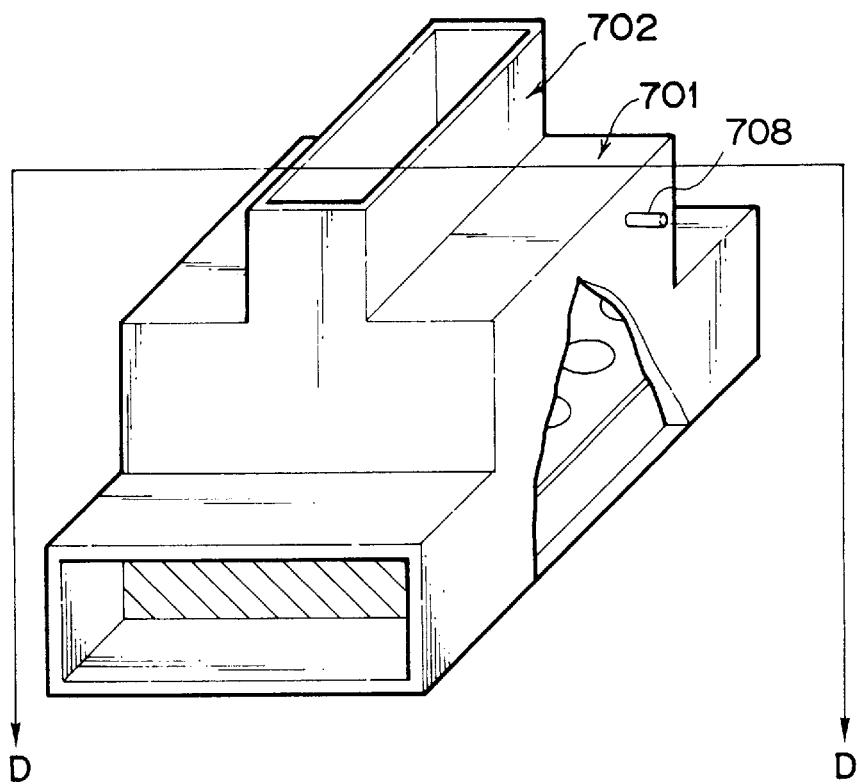
Figure 7B:
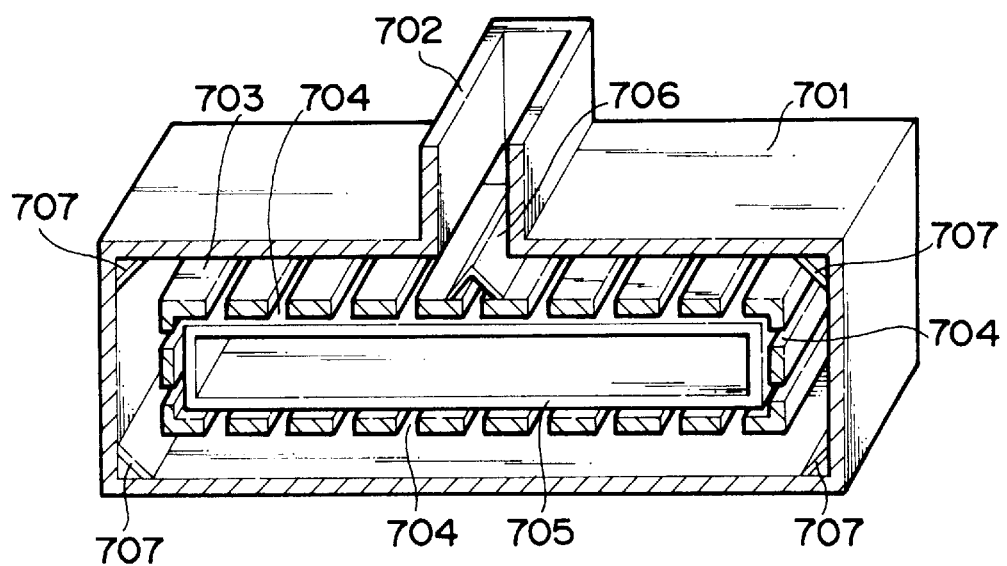

FIG. 7A and its cross section FIG. 7B along the line D—D in FIG. 7A illustrate still another embodiment of the plasma-assisted CVD device used in the process for producing the optical recording medium of the present invention, which is characterized in that the film forming chamber and plasma chamber in the CVD device shown in FIGS. 6A to 6C are integrally constructed. More specifically, in FIGS. 7A and 7B, reference numeral 701 denotes an endless ring waveguide; 702, a microwave introducing portion; 703, an inner wall of the ring waveguide; 704, slots made in the inner wall; 705, a plasma chamber serving also as a film forming chamber; 706, a dividing block; 707, reflective blocks; and 708, a gas feeding means.

Using this device, inorganic dielectric films can be formed in the same manner as previously described, except that the CVD device of the present embodiment may preferably be used to form inorganic dielectric films that can be formed using a single gas species as in the formation of Si semi-conductor films as described later.

As the gas used to form the inorganic dielectric films for optical recording media by the plasma-assisted CVD of the present invention, when, for example, films of silicon type semiconductors such as a-Si and SiC are formed as the inorganic dielectric films, it is preferable to use the starting material gas containing Si atoms, at least one of which is gaseous at normal temperature and normal pressure or is readily gasifiable, exemplified by inorganic silanes such as SiH and $SiH_6$, organic silanes such as tetraethylsilane (TES), tetramethylsilane (TMS) and dimethylsilane (DMS) and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$ and $SiCl_2F_2$. When films of silicon compounds such as $SiN_x$, SiO and $SiO_2$ are formed as the inorganic dielectric films, it is preferable to use under appropriate selection, as the Si atom-containing starting material gas, any of those which are gaseous at normal temperature and normal pressure or are readily gasifiable, as exemplified by inorganic silanes such as $SiH_4$ and $SiH_6$, organic silanes such as tetraethoxylsilane (TEOS), tetramethoxylsilane (TMOS) and octamethylcyclotetrasilane (OMCTS) and halosilanes such as $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$ and $SiCl_2F_2$, and as reaction gases those exemplified by $NH_3$, $N_2H_4$, hexamethyl-disilazane (HMDS), $O_2$, $O_3$, $H_2O$, NO, $N_2O$ and $NO_2$.

When thin films of metal compounds such as AlN, $Al_2O_3$, $TiO_2$ and $Ta_2O_5$ are formed as the inorganic dielectric films, it is preferable to use under appropriate selection, as the metal atom-containing starting material gas, any of those exemplified by organic metals such as trimethyl aluminum (TMAl), triethyl aluminum (TEAl), triisobutyl aluminum LTIBAl) and dimethylaluminum hydride (DMAlH) and halogenated metals such as $AlCl_3$, $TiCl_3$ and $TaCl_5$, and as the reaction gas, those exemplified by $O_2$, $O_3$, $H_2O$, NO, $N_2O$, $NO_2$, $N_2$, $NH_3$, $N_2H_4$ and hexamethyldisilazane (HMDS).

When two kinds of gases, the starting material gas and the reaction gas, are used to form the inorganic dielectric film as stated above, it is preferable to feed the reaction gas and the starting material gas into each of the plasma chamber 201 and film forming chamber 202 shown in FIGS. 2A and 2B.

In particular, when the reaction gas is fed into the plasma chamber 201 from the gas feeding means 207 and the starting material gas is fed into the film forming chamber 202 from the gas feeding means 208, the internal stress in the inorganic dielectric films for optical recording media formed on the substrates can be further decreased, and also inorganic dielectric films that can provide high-quality optical recording media can be produced in a very good efficiency.

Conditions under which the inorganic dielectric films for optical recording media are formed using the plasma-assisted CVD devices according to the above various embodiments of the present invention will be described below. The microwaves usable in the present invention may include an electro-magnetic wave with a frequency ranging from 300 MHz to 300 GHz. In particular, electromagnetic waves with a frequency of 2.45 GHz can be preferably used.

The power applied from the microwave power source may vary depending on the peripheral length of the ring waveguide and the types of the reaction gas and/or starting material gas. For example, when the peripheral length of the ring waveguide is 600 to 1,250 mm, this length corresponds to a length 3 to 24 times the waveguide wavelength, the length of each slot is ¼ to ⅜ of the waveguide wavelength and an inorganic silane, organic silane or halosilane is used as the starting material gas, the power may preferably be set at from 0.5 to 5.0 kW, and particularly from 1.0 to 2.5 kW. As for the total pressure of the starting material gas or reaction gas or a mixed gas of these inside the plasma chamber and/or the film forming chamber, films may preferably be formed at a total pressure ranging from 0.5 to 5 Pa, and particularly preferably from 0.5 to 2 Pa.

In the process for producing the optical recording medium of the present invention, there are no particular limitations on the constitution other than that for the step in which the inorganic dielectric film is formed by the plasma-assisted CVD characterized in the present invention as described above. For example, the order of the steps of forming the inorganic dielectric films and the step of forming the optical recording film is by no means limited to the order in the in-line process shown in FIG. 1, and the films may be successively formed according to the desired constitution of the optical recording medium.

With regard to the step of forming the recording film, known film forming processes suited to the properties of materials used in recording films may used. Stated specifically, processes as exemplified by vacuum deposition, sputtering and wet coating may be used.

In the present invention, any recording films can be used without any particular limitations so long as they are recording films capable of recording and reproducing information upon irradiation with a light beam. In particular, it is preferable to use an amorphous magnetic film containing a rare earth element and/or a transition metal, for example, an amorphous magnetic film containing a rare earth element and/or a transition metal, comprised of Tb-Fe-Co, Gd-Fe-Co, Tb-Fe-Co-Cr, Gd-Fe-Co-Cr or the like, a magneto-optical recording film having a multi-layer thereof, and a recording film containing a chalcogenide element as exemplified by Te. These films have strong corrosion resistance and hence, since the inorganic dielectric film is required to have a particularly good recording layer protective performance, can more effectively facilitate the advantages attributable to the process for producing the optical recording medium of the present invention. Thus, they are preferred in this respect.

In the optical recording medium according to the present invention, the thickness of the inorganic dielectric film is determined in accordance with the materials and constitution for the recording layer and the properties of the inorganic dielectric film. For example, when two layers of inorganic dielectric films are so formed as to hold a magneto-optical recording film between them as shown in FIGS. 4A and 4B, the inorganic dielectric film formed between the substrate and the magneto-optical recording film may preferably be in a thickness of about 100 to 1,500 Å, and the inorganic dielectric film formed on the magneto-optical recording film in a thickness of about 100 to 1,000 Å, taking account of the protection of the recording layer and the enhancement of Kerr rotational angles at the time of signal reproduction.

A protective layer may also be optionally provided on the recording layer, inorganic dielectric film or reflective layer of the optical recording medium obtained by its production process of the present invention. In such an instance, the protective layer can be formed, for example, by applying a photocurable resin on the recording layer in a given thickness (e.g., 10 to 30 μm), followed by irradiation with light to effect curing, or attaching a resin sheet having been molded in a given thickness (e.g., a polycarbonate resin sheet or a polyester resin sheet) onto the recording layer, inorganic dielectric film or reflective layer by the aid of an adhesive or a pressure-sensitive adhesive. In particular, when the resin sheet having been molded in a given thickness is used as the protective layer, the internal stress possessed by the protective layer can prevent the optical recording medium from its deformation. Hence, this is particularly preferable in the present invention.

As the substrate of the optical recording medium according to the present invention, any substrates commonly used as substrates for optical recording media can be used. For example it is possible to use substrates comprising glass, bisphenol polycarbonate resin or other modified polycarbonate resin or amorphous polyolefin resin.

As described above, the present invention makes it possible to form inorganic dielectric films for optical recording media, having superior enhancement effect and recording layer protective performance, at a rate much higher than film forming rate of conventional plasma-assisted CVD, so that it becomes possible to produce high-quality optical recording media at a low cost.

The present invention also makes it possible to form inorganic dielectric films for optical recording media in a uniform state and a high quality without regard to the position of substrates placed in the film forming chamber, so that optical recording media can be continuously produced with great ease and high-quality optical recording media can be produced at a lower cost.

EXAMPLES

The present invention will be described below in greater detail by giving Examples.

Example 1

On a doughnut-shaped disk substrate made of polycarbonate resin (trade name: IUPILON H4000; available from Mitsubishi Gas Chemical Company, Inc.) having an outer diameter of 86 mm, an inner diameter of 15 mm and a thickness of 1.2 mm and on one side of which a pregroove with a width of 0.6 μm, a pitch of 1.6 μm and a depth of 800 Å had been formed in a spiral, a first dielectric film comprising an amorphous silicon (a-Si:H) film of 72 nm thick, a recording layer comprising an amorphous Gd-Fe-Co magnetic layer of 10 nm thick, a superposed film comprising an amorphous Tb-Fe-Co magnetic layer of 20 nm thick, a second dielectric film comprising an a-Si:H film of 30 nm thick and a reflective layer comprising an Al film of 60 nm thick were superposed in order on its side on which the tracking groove had been formed, to obtain a magneto-optical disk. The films were formed in the following way.

In the first place, the in-line type film forming apparatus as shown in FIG. 1 was set up. In this film forming apparatus, the first and second a-Si:H film forming chambers 103 and 105 were each constituted of the plasma-assisted CVD device as shown in FIGS. 2A and 2B.

The plasma-assisted CVD device used here was comprised of a cylindrical plasma chamber 201 with an outer diameter of 326 mm, an inner diameter of 320 mm and a length of 115 mm and a cylindrical film forming chamber 202 with an outer diameter of 326 mm, an inner diameter of 320 mm and a length of 210 mm, placed directly below chamber 206 which were joined together in the manner that their axes came in agreement with each other.

Figure 9:
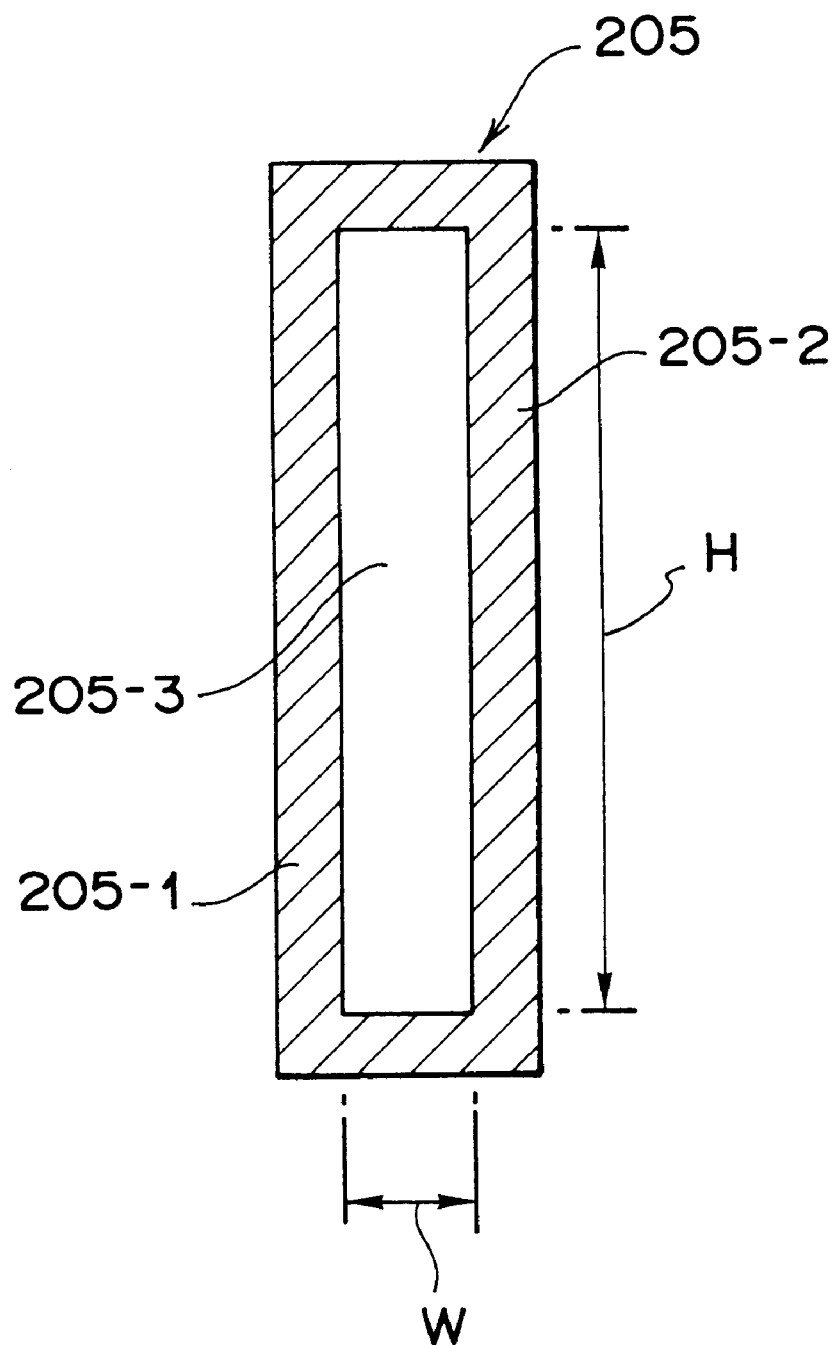
FIG. 9 is a schematic cross section of an embodiment of the endless ring waveguide according to the present invention.

The ring waveguide 205 was comprised of a waveguide having an inside empty space with a cross-sectional size of 27 mm in width (W) and 96 mm in height (H) (see FIG. 9) and a center diameter of 354 mm, the same as those of a waveguide of the WRT-2 standard, made of stainless steel, whose inner surfaces were coated with copper and further coated thereon with silver in order to prevent propagation loss of the microwaves and in the inner wall of which rectangular slots 301 of 42 mm long and 4 mm wide were made at intervals of about 40 mm to provide 28 (twenty eight) slots.

As the dividing block, a block having a cross section of a right-angled isosceles triangle, the longer side of which was 27 mm, the same as the width of the empty space of the waveguide 205, made of aluminum, was welded to the ring waveguide inner wall at the position opposing the microwave introducing portion so that the microwaves are equally divided.

Next, a substrate holder 107 to which three sheets of disk substrates 100 were fitted in a row was put into the substrate feeding chamber 101 of the in-line type film forming apparatus having the a-Si:H film forming chambers constructed as described above. Then, the substrates were transported to the degassing chamber, and thereafter the substrates thus treated were transported to the first a-Si:H film forming chamber 103 to form therein the first a-Si:H film on each substrate.

The a-Si:H film was formed under conditions as follows: The insides of the plasma chamber 201 and film forming chamber 202 were evacuated to a vacuum of $10^{-4}$ Pa by means of a vacuum pump, and thereafter Ar gas was fed into the plasma chamber from the gas feeding means 207 at a flow rate of 200 sccm, and $SiH_4$ gas was fed into the film forming chamber from the gas feeding means 208 at a flow rate of 500 sccm so that the insides of the plasma chamber and film forming chamber were kept at a pressure of 1.3 Pa.

Next, microwaves with a frequency of 2.45 GHz and a power of 1.5 kW was introduced from a microwave power source into the ring waveguide through the microwave introducing portion to form the a-Si:H film. At this time, wavelength in the waveguide was 159 mm. As a result, the formation of a first a-Si:H film of 72 nm thick was completed in about 5 to 6 seconds, and the a-Si:H film was deposited at a rate of about 800 nm/min. Immediately after the film formation, the temperature of each substrate was about 50° C.

After the first a-Si:H film had been formed, the resulting substrates were transported to the recording film forming chamber, where a Gd-Fe-Co film and a Tb-Fe-Co film were formed on each substrate by RF sputtering.

As a sputtering target, a Gd-Fe-Co alloy target of 150 mm×470 mm and 6 mm thick or a Tb-Fe-Co alloy target with the same size was used. The RF sputtering was carried out under conditions as follows: The inside of the chamber was evacuated to a vacuum of $1\times10^{-5}$ Pa, and thereafter Ar gas was fed at a pressure of 0.1 Pa and a power density of 5.6 W/cm$^2$.

After the recording film had been formed, the resulting substrates were transported to the second a-Si:H film forming chamber 105 and the a-Si:H film was formed on each substrate under the same conditions as the formation of the first a-Si:H film. Thus, the second a-Si:H film was formed in 2 to 3 seconds.

Next, the resulting substrates were transported to the reflective film forming chamber, where an Al reflective film was formed on each substrate by sputtering. As a sputtering target, an Al target of 150 mm×470 mm and 6 mm thick was used. The sputtering was carried out under conditions as follows: The inside of the chamber was evacuated to a vacuum of $1\times10^{-5}$ Pa, and thereafter Ar gas was fed at a pressure of 0.3 Pa and a power density of 5 to 7 W/cm$^2$.

Subsequently, the three substrates on which the above films had been formed were taken out of the in-line type film forming apparatus, and then a rubber type adhesive comprised of a mixture of 100 parts by weight of a styrene/butadiene copolymer (trade name: CALIFLEX TR1107; available from Shell Chemical Co.), 50 parts by weight of modified wood rosin and 1 part by weight of a stabilizer was applied on the Al reflective film in a thickness of 2 $\mu$m. Thereafter, on the pressure-sensitive adhesive layer formed, a film of 6 $\mu$m thick of cured urethane acrylate ultraviolet curable resin was superposed. Thus, magneto-optical disks were produced.

Evaluation on the three magneto-optical disks thus obtained in the same lot was made by measuring their C/N (carrier-to-noise) ratio and byte error rate (B.E.R.) on values at the intial stage and values obtained after standing in an environment of 80° C. and 85%RH for 1,500 hours (hereinafter "after standing").

With regard to the C/N ratio and B.E.R., the magneto-optical disks were each set on a magneto-optical disk recording-reproducing detector (trade name: LN52A; manufactured by Shibasoku K.K.) and information was recorded and reproduced to measure the values.

The recording and reproducing were made under the following conditions.
Linear velocity: 9.04 m/sec.
Recording frequency: 6 MHz
Recording power: 10 mW
Reproducing power: 1 mW
Recording-reproducing wavelength: 830 nm Tilt angles of the magneto-optical disks thus produced were also measured using a tilt angle measuring device (trade name: LM-100; manufactured by Ono Sokuki K.K.).

Results thus obtained are shown in Table 1. In Table 1, in the evaluation of the C/N ratio after standing, an instance where the amount of changes before and after standing was less than 3 dB or less is evaluated as "A", an instance where it was 3 to 8 dB as "B", and an instance where it was more than 8 dB as "C".

With regard to B.E.R., an instance where the value after standing was on the same order as the initial stage value is evaluated as "A", an instance where the former increased by one order as "B", and an instance where the former increased by two or more orders as "C".

With regard to tilt angles, an instance where the changes were not more than 5 mrad is evaluated as "A", and an instance where they were more than 5 mrad as "B".

Stress and refractive index of the first a-Si:H films prepared by the plasma-assisted CVD described above were also measured in the following way.

Namely, under the same film forming conditions as described above, a-Si:H films were formed on glass disks of 30 mm diameter and 1.0 mm thick used for measuring stress, and any deformation of such substrates was detected as the number of Newton's rings by the use of an interferometer. Here, when the number of Newton's rings is represented by m, a curvature radium $\gamma$ is determined by the following expression (1).

$$\gamma = a^2/m\lambda \qquad (1)$$

wherein;

a: a radius of the substrate; and $\lambda$: a wavelength of a light source used in the interferometer.

Now, substitution of the value of $\gamma$ for the following expression (2) can determine a stress $\nu$ of the first a-Si:H film.

$$\sigma = Eb^2/6(1-\nu)\gamma d \qquad (2)$$

wherein;

E: Young's modulus of the substrate;

$\nu$: Poisson's ratio of the substrate;

$\gamma$: curvature radius of the substrate;

d: thickness of the a-Si:H film; and b: thickness of the substrate.

The refractive index of the the a-Si:H film is calculated from reflectance in spectral properties of a sample prepared by forming films on a glass substrate. Reflectance is measured on one sample at its ten spots arbitrarily selected and an average of the values of reflectance calculated therefrom is regarded as the refractive index of the sample.

To also measure thickness uniformity of the first a-Si:H films formed by the plasma-assisted CVD described above, three sheets of glass disks of 86 mm diameter and of 1.2 mm thick were prepared, and a-Si:H films of 72 nm thick were simultaneously formed thereon in entirely the same manner as the plasma-assisted CVD described above. The film thickness of each a-Si:H film was measured at its 20 points arbitrarily selected in a region between a circle of 24 mm radius and a circle of 40 mm radius on the disk (which region corresponds to the effective region of the magneto-optical disk). Then, its film thickness distribution was evaluated in the following way: An instance where the thicknesses at all measuring points are all within ±2.5% with respect to the standard thickness was evaluated as "AA"; an instance where the thickness at any one of measuring points is more than ±2.5% to not more than ±3% with respect to the standard thickness, as "A"; an instance where the thickness at any one of measuring points is more than ±3% to not more than ±5% with respect to the standard thickness, as "B"; and an instance where the thickness at any one of measuring points is more than ±5% with respect to the standard thickness, as "C".

Three sheets of disk substrates of 86 mm diameter and 1.2 mm thick, made of polycarbonate resin (trade name: IUPILON H4000; available from Mitsubishi Gas Chemical Company, Inc.) were newly prepared, and a-Si:H films of 200 nm thick were simultaneously formed thereon by plasma-assisted CVD in entirely the same procedure as described above. On the films thus formed, their adhesion to the substrate was measured by a cross-cut test.

The cross-cut test was made in the following way: First, cuts were made with a blade in the dielectric film formed on the substrate in such a way that 25 squares in total were formed having 3 mm side, and an adhesive tape with an adhesive force of 2 kgf/cm was stuck to that portion. Thereafter the tape was peeled off in the direction perpendicular to the film surface. This test was made at 6 spots arbitrarily selected per each disk.

Results thus obtained are shown in Table 1.

The adhesion was evaluated according to the following criteria.

A: No separation of dielectric films occurred at all the 6 spots where the cross-cut test was made.

B: Separation of 1 to 3 squares occurred at least one spot of the 6 spots where the cross-cut test was made.

C: Separation of more than 3 squares occurred at least one spot of the 6 spots where the cross-cut test was made.

Comparative Example 1

Figure 8:
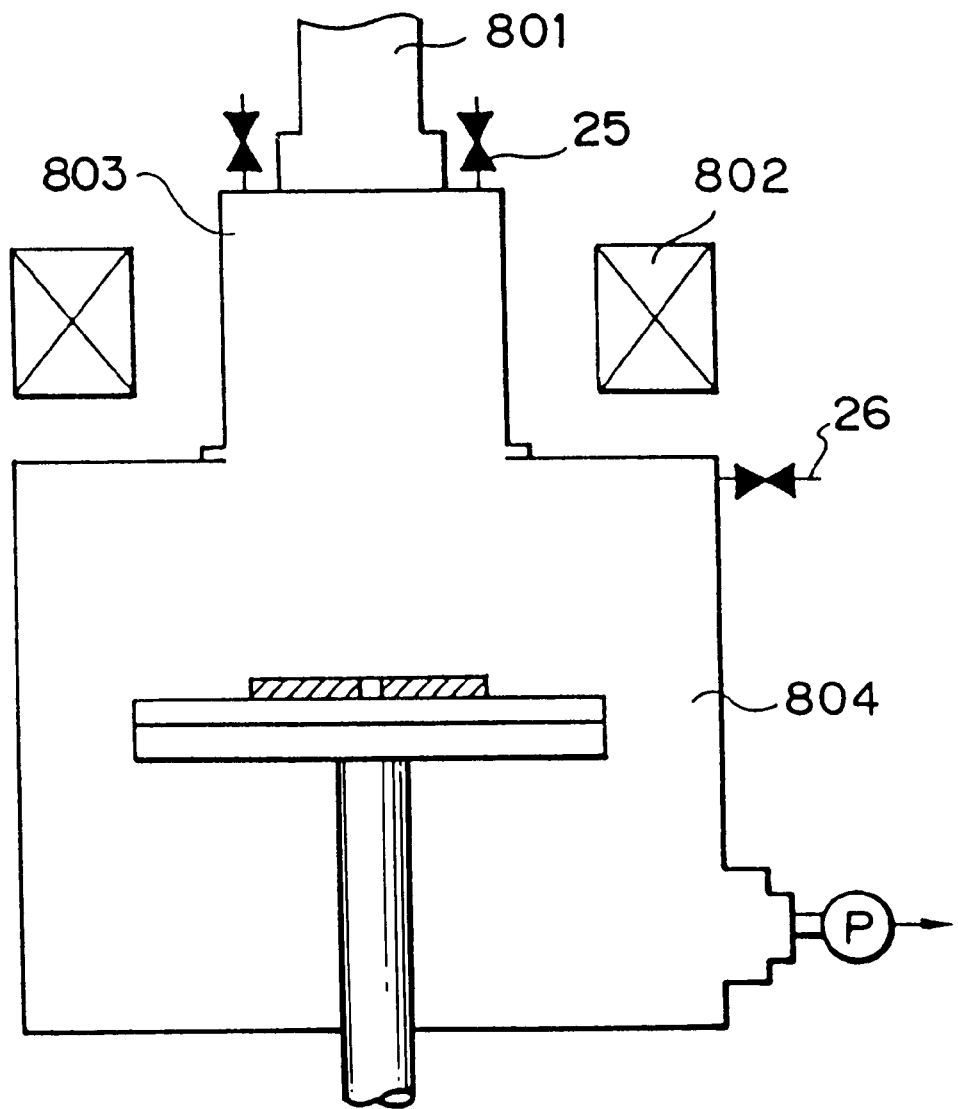
FIG. 8 is a schematic cross section of a conventional device for forming an inorganic dielectric film for an optical recording medium.

Example 1 was repeated to simultaneously produce three sheets of magneto-optical disks, except that the first a-Si:H film and second a-Si:H film forming devices used in Example 1 were each replaced with an electron cyclotron resonance (ECR) plasma-assisted CVD film forming device having as shown in FIG. 8 a means 801 for guiding microwaves into a plasma chamber 803 from one end of the plasma chamber, and a coil 802 for causing electron cyclotron resonance in the plasma inside the chamber.

In the present Comparative Example, the a-Si:H films were formed under conditions as follows: The internal stress of each a-Si:H film was so set as to be in the range of a stress (0 to −30 kg/mm$^2$) tolerable for inorganic dielectric films for magneto-optical disks. Stated-specifically, microwaves with a frequency of 2.45 GHz were guided into the plasma chamber 803 from the waveguide 801 and also a magnetic field (875 gauss) satisfying the conditions for electron cyclotron resonance was produced inside the chamber by means of the coil 802 provided on the outside of the chamber. The microwave power was adjusted to 500 W; the gas flow rate, to 10 sccm of SiH$_4$ and 30 sccm of Ar, and the gas pressure in the plasma chamber 803 and a film forming chamber 804 each, to 1.0 Pa. The plasma chamber 803, the film forming chamber 804 and the substrates were arranged in the same manner as in Example 1.

The internal stress of the a-Si:H films thus formed was −30 kg/mm or less.

On the magneto-optical disks thus produced, evaluation was made in the same manner as in Example 1. As a result, no evaluation was possible on the disks other than the disk produced on the substrate positioned at the middle among the three substrates.

Properties of the a-Si:H films obtained by the process of the present Comparative Example were also observed in the same manner as in Example 1. As a result, as shown in Table 1, it was possible to uniformly form the dielectric film with a given thickness only on the substrate positioned at the middle among the three substrates, and also, even though the substrates are in the same lot, the dielectric films were seen to be formed in uneven thickness on these substrates. Thus, it was not worthwhile to make evaluation other than for the dielectric films formed on the substrate positioned at the middle among the three substrates.

The magneto-optical disk produced using the substrate positioned at the middle in the chamber, on which the dielectric film with a uniform thickness was formed, was seen to cause a great decrease in C/N ratio and a great increase in B.E.R. when stored in an environment of high temperature and high humidity. Also, their film forming rate was about 60 nm/min.

TABLE 1

| | C/N ratio | | B.E.R. | Tilt | Film forming | Substrate | Film thickness | Refrac- | Adhe- | Dielectric |
| --- | --- | --- | --- | --- | --- | --- | --- | --- | --- | --- |
| | Initial value | After standing | After standing | angle (mrad) | rate (nm/min) | temp. (° C.) | distribution | tive index | sion | stress (kg/mm$^2$) |
| Example: | | | | | | | | | | |
| 1-1 | 46 | A | A | A | 800 | 50 | A | 3.7 | A | −3.0 |
| 1-2 | 46 | A | A | A | " | " | A | " | " | " |
| 1-3 | 46 | A | A | A | " | " | A | " | " | " |
| Comparative Example: | | | | | | | | | | |
| 1-1 | — | — | — | B | — | — | C | — | — | — |
| 1-2 | 46 | C | C | A | 60 | 50 | A | 3.7 | C | ≦−30 |
| 1-3 | — | — | — | B | — | — | C | — | — | — |

Example 2

Example 1 was repeated to produce magneto-optical disks, except that the magneto-optical disks were produced in the layer configuration as shown below and the first and second inorganic dielectric films were formed under conditions also shown below.

On the magneto-optical disks thus produced, evaluation was made in the same manner as in Example 1. Properties of the Si$_3$N$_4$ films formed by this process were also evaluated in the same manner as in Example 1. Results obtained are shown in Table 2.

| Configuration | Example 2 | |
| --- | --- | --- |
| Reflective film: | Al | 60 nm |
| 2nd dielectric film: | Si$_3$N$_4$ | 30 nm |
| Recording film: | GdFeCo/TbFeCo | 10/20 nm |
| 1st dielectric film: | Si$_3$N$_4$ | 95 nm |

-continued

| Dielectric film, film forming conditions | |
|---|---|
| Gas species: | SiH$_4$, N$_2$ |
| Exhaust pressure: | 1 × 10$^{-4}$ Pa |
| Gas pressure: | 1.3 Pa |
| Gas low rate: | SiH$_4$: 200 sccm |
| | N$_2$: 500 sccm |
| Applied power: | 1.5 kw |

Comparative Example 3

Example 2 was repeated to simultaneously produce three sheets of magneto-optical disks, except that the first Si$_3$N$_4$ film and second Si$_3$N$_4$ film forming devices used in Example 2 were each replaced with an electron cyclotron resonance (ECR) plasma-assisted CVD film forming device having as shown in FIG. 8 a means 801 for guiding microwaves into a plasma chamber 803 from one end of the plasma chamber and a coil 802 for causing electron cyclotron resonance in the plasma inside the chamber.

In the present Comparative Example, the Si$_3$N$_4$ films were formed under conditions as follows: The internal stress of each Si$_3$N$_4$ film was so set as to be in the range of a stress (0 to −30 kg/mm$^2$) tolerable for inorganic dielectric films for magneto-optical disks. Stated specifically, microwaves with a frequency of 2.45 GHz were guided into the plasma chamber 803 from the waveguide 801 and also a magnetic field (875 gauss) satisfying the conditions for electron cyclotron resonance was produced inside the chamber by means of the coil 802 provided on the outside of the chamber. The microwave power was adjusted to 650 W; the gas flow rate, to 10 sccm of SiH$_4$ and 30 sccm of N$_2$, and the gas pressure in the plasma chamber 803 and a film forming chamber 804 each, to 1.0 Pa. The plasma chamber 803, the film forming chamber 804 and the substrates were arranged in the same manner as in Example 1.

On the magneto-optical disks thus produced, evaluation was made in the same manner as in Example 1. As a result, no evaluation was possible on the disks other than the disk produced on the substrate positioned at the middle among the three substrates.

Properties of the Si$_3$N$_4$ films obtained by the process of the present Comparative Example were also observed in the same manner as in Example 1. As a result, as shown in Table 2, it was possible to uniformly form the dielectric film with a given thickness only on the substrate positioned at the middle among the three substrates, and also, even though the substrates are in the same lot, the dielectric films were seen to be formed in uneven thickness on these substrates. Thus, it was not worthwhile to make evaluation other than for the dielectric films formed on the substrate positioned at the middle among the three substrates.

The magneto-optical disk produced using the substrate positioned at the middle in the chamber, on which the dielectric film with a uniform thickness was formed, was seen to cause a great decrease in C/N ratio and a great increase in B.E.R. when stored in an environment of high temperature and high humidity. Also, their film forming rate was about 60 nm/min.

TABLE 2

| | C/N ratio | | B.E.R. | Tilt | Film forming | Substrate | Film thickness | Refractive | Adhesion | Dielectric stress |
|---|---|---|---|---|---|---|---|---|---|---|
| | Initial value | After standing | After standing | angle (mrad) | rate (nm/min) | temp. (° C.) | distribution | index | | (kg/mm$^2$) |
| Example: | | | | | | | | | | |
| 3-1 | 48 | A | A | A | 850 | ≦50 | A | 2.0 | A | −2.0 |
| 3-2 | " | " | " | " | " | " | " | " | " | " |
| 3-3 | " | " | " | " | " | " | " | " | " | " |
| Comparative Example: | | | | | | | | | | |
| 2-1 | — | — | — | — | — | — | C | — | — | — |
| 2-2 | 48 | C | C | A | 60 | ≦50 | A | 2.0 | C | ≦−30 |
| 2-3 | — | — | — | — | — | — | C | — | — | — |

Examples 3 to 8

Example 1 was repeated to produce magneto-optical disks, except that the magneto-optical disks were produced in the layer configuration as shown in Table 3 and the first and second inorganic dielectric films were formed under conditions also shown in Table 3. Evaluation was also made similarly.

Properties of the inorganic dielectric films formed under the respective conditions were also evaluated in the same manner as in Example 1. Results obtained are shown in Table 4.

TABLE 3

| Configuration | Example 3 | | Example 4 | | Example 5 | |
|---|---|---|---|---|---|---|
| Reflective film: | Al | 60 nm | Al | 60 nm | Al | 60 nm |
| 2nd dielectric film: | a-Si:H | 30 nm | Si$_3$N$_4$ | 30 nm | SiO$_2$ | 30 nm |

TABLE 3-continued

| | | | | | |
|---|---|---|---|---|---|
| Recording film: | TbFeCo 30 nm | TbFeCo 20 nm | GdFeCo/TbFeCo | 10 nm/20 nm | |
| 1st dielectric film: | a-Si:H 57 nm | $Si_3N_4$ 110 nm | $SiO_2$ | 95 nm | |
| Dielectric film, film forming conditions | | | | | |
| Gas species: | $SiH_4$, Ar | $SiH_4$, N | $SiH_4$, $O_2$ | | |
| Exhaust pressure: | $1 \times 10^{-1}$ Pa | $1 \times 10^{-4}$ Pa | $1 \times 10^{-4}$ Pa | | |
| Gas pressure: | 1.3 Pa | 1.3 Pa | 1.3 Pa | | |
| Gas flow rate: | $SiH_4$: 200 sccm | $SiH_4$: 200 sccm | $SiH_4$: 200 sccm | | |
| | Ar: 300 sccm | $N_2$: 1,000 sccm | $O_2$: 500 sccm | | |
| Applied power: | 1.5 kw | 1.5 kw | 1.5 kw | | |

| Configuration | Example 6 | | Example 7 | | Example 8 | |
|---|---|---|---|---|---|---|
| Reflective film: | Al | 60 nm | Al | 60 nm | Al | 60 nm |
| 2nd dielectric film: | $SiO_2$ | 30 nm | SiC | 30 nm | SiC | 30 nm |
| Recording film: | TbFeCo | 20 nm | GdFeCo/TbFeCo | 10 nm/20 nm | TbFeCo | 20 nm |
| 1st dielectric film: | $SiO_2$ | 95 nm | SiC | 85 nm | SiC | 110 nm |
| Dielectric film, film forming conditions | | | | | | |
| Gas species: | $SiH_4$, $O_2$ | | $SiH_4$, $C_2H_2$ | | $SiH_4$, Ar | |
| Exhaust pressure: | $1 \times 10^{-4}$ Pa | | $1 \times 10^{-4}$ Pa | | $1 \times 10^{-4}$ Pa | |
| Gas pressure: | 1.3 Pa | | 1.3 Pa | | 1.3 Pa | |
| Gas flow rate: | $SiH_4$: 200 sccm | | $SiH_4$: 200 sccm | | $SiH_4$: 200 sccm | |
| | $O_2$: 800 sccm | | $C_2H_2$: 200 sccm | | $C_2H_2$: 400 sccm | |
| Applied power: | 1.5 kw | | 1.5 kw | | 1.5 kw | |

Example 9

Example 3 was repeated to produce phase change optical disks, except that the magneto-optical recording films in Example 3 was replaced with recording films comprised of an Sb-Te alloy and formed by magnetron sputtering.

On the resulting optical disks, the respective properties were evaluated in the same manner as in Example 3.

Results obtained are shown in Table 4.

In the present Example, the C/N ratio and B.E.R. of the optical disks were measured using an optical disk evaluation device (trade name: OMS-2000; manufactured by Nakamichi K.K.).

TABLE 4

| Example: | C/N ratio Initial value | C/N ratio After standing | B.E.R. After standing | Tilt angle (mrad) | Film forming rate (nm/min) | Substrate temp. (°C.) | Film thickness distribution | Refractive index | Adhesion | Dielectric stress (kg/mm²) |
|---|---|---|---|---|---|---|---|---|---|---|
| 3-1 | 46 | A | A | A | 800 | 50 | A | 3.7 | A | −3.0 |
| 3-2 | 46 | A | A | A | 800 | 50 | A | 3.7 | A | −3.0 |
| 3-3 | 46 | A | A | A | 800 | 50 | A | 3.7 | A | −3.0 |
| 4-1 | 48 | A | A | A | 950 | ≦50 | A | 1.8 | A | −2.0 |
| 4-2 | 48 | A | A | A | 950 | ≦50 | A | 1.8 | A | −2.0 |
| 4-3 | 48 | A | A | A | 950 | ≦50 | A | 1.8 | A | −2.0 |
| 5-1 | 48 | A | A | A | 850 | ≦50 | A | 2.0 | A | −2.0 |
| 5-2 | 48 | A | A | A | 850 | ≦50 | A | 2.0 | A | −2.0 |
| 5-3 | 48 | A | A | A | 850 | ≦50 | A | 2.0 | A | −2.0 |
| 6-1 | 48 | A | A | A | 950 | ≦50 | A | 1.7 | A | −2.0 |
| 6-2 | 48 | A | A | A | 950 | ≦50 | A | 1.7 | A | −2.0 |
| 6-3 | 48 | A | A | A | 950 | ≦50 | A | 1.7 | A | −2.0 |
| 7-1 | 47 | A | A | A | 950 | ≦65 | A | 1.9 | A | −2.0 |
| 7-2 | 47 | A | A | A | 950 | ≦65 | A | 1.9 | A | −2.0 |
| 7-3 | 47 | A | A | A | 950 | ≦65 | A | 1.9 | A | −2.0 |
| 8-1 | 47 | A | A | A | 950 | ≦65 | A | 1.7 | A | −2.0 |
| 8-2 | 47 | A | A | A | 950 | ≦65 | A | 1.7 | A | −2.0 |
| 8-3 | 47 | A | A | A | 950 | ≦65 | A | 1.7 | A | −2.0 |
| 9-1 | 47 | A | A | A | 850 | ≦50 | A | 2.0 | A | −2.0 |
| 9-2 | 47 | A | A | A | 850 | ≦50 | A | 2.0 | A | −2.0 |
| 9-3 | 47 | A | A | A | 850 | ≦50 | A | 2.0 | A | −2.0 |

Example 10

Five sheets of magneto-optical disks having the same layer configuration as the magneto-optical disks produced in Example 4 were simultaneously produced using the inorganic dielectric film forming device as shown in FIG. 6.

The FIG. 6 film forming device used in the present Example was comprised of a plasma chamber with a length of 532 in the substrate transport direction, a height of 144 mm and a width of 182 mm, and a film forming chamber with a length of 526 mm, a width of 182 mm and a height of 100 mm. The ring waveguide used herein had a width 27 mm and a height of 96 mm as the size of a cross section of the empty space of the waveguide, and had a such a shape that its inner wall was in substantially close contact with the outer wall of the plasma chamber. The inner surface of this waveguide was coated with copper and further coated thereon with silver. The inner wall 607 of the waveguide was provided with 40 rectangular slots of 42 mm long and 3 mm wide at intervals of 40 mm.

mixed gas was fed into the plasma chamber from the gas feeding means 611.

On the magneto-optical disks thus obtained, evaluation was made in the same manner as in Example 1 and also the properties of the $Si_3N_4$ films obtained by the present process were evaluated in the same manner as in Example 1.

Results obtained are shown in Table 5.

TABLE 5

| Example: | C/N ratio | | B.E.R. | Tilt | Film forming | Sub-strate | Film thick-ness | Refrac- | Adhe- | Dielec-tric |
|---|---|---|---|---|---|---|---|---|---|---|
| | Initial value | After standing | After standing | angle (mrad) | rate (nm/min) | temp. (° C.) | distri-bution | tive index | sion | stress (kg/mm²) |
| 10-1 | 48 | A | A | A | 950 | ≦50 | A | 1.8 | A | −2.0 |
| 10-2 | 48 | A | A | A | 950 | ≦50 | A | 1.8 | A | −2.0 |
| 10-3 | 48 | A | A | A | 950 | ≦50 | A | 1.8 | A | −2.0 |
| 10-4 | 48 | A | A | A | 950 | ≦50 | A | 1.8 | A | −2.0 |
| 10-5 | 48 | A | A | A | 950 | ≦50 | A | 1.8 | A | −2.0 |
| 11-1 | 48 | A | A | A | 600 | ≦50 | A | 1.9 | A | −2.0 |
| 11-2 | 48 | A | A | A | 600 | ≦50 | A | 1.9 | A | −2.0 |
| 11-3 | 48 | A | A | A | 600 | ≦50 | A | 1.9 | A | −2.0 |
| 11-4 | 48 | A | A | A | 600 | ≦50 | A | 1.9 | A | −2.0 |
| 11-5 | 48 | A | A | A | 600 | ≦50 | A | 1.9 | A | −2.0 |

As the dividing block, a block having a cross section of a right-angled isosceles triangle, the longer side of which was 27 mm, made of aluminum, was welded to the ring waveguide inner wall at its position opposing the microwave introducing portion so that the microwaves were equally divided in the both directions inside the waveguide.

As reflective blocks, blocks made of aluminum, each having a right-angled isosceles triangle in a cross section and short sides of 27 mm long were welded to the respective corners of the inner wall of the ring waveguide as shown in FIG. 6B.

The first and second $Si_3N_4$ films were formed under conditions as shown below.
Film Forming Conditions
Gas species: $SiH_4$, $N_2$
Exhaust pressure: $1\times10^{-4}$ Pa
Gas pressure: 1.3 Pa
Gas flow rate: $SiH_4$: 200 sccm $N_2$: 1,000 sccm
Applied power: 1.5 kw
Frequency: 2.45 GHz The $SiH_4$ gas was fed into the film forming chamber from the gas feeding means 612, and $N_2$ gas was fed into the plasma chamber from the gas feeding means 611 to form the $Si_3N_4$ films on the substrates arranged in series in the direction of substrate transport in the film forming chamber.

In the present Example, the magneto-optical disks were produced in entirely the same manner as in Example 4 except for the manner by which the first $Si_3N_4$ film and the second $Si_3N_4$ film were formed. On the magneto-optical disks thus produced, evaluation was made in the same manner as in Example 1, and also the properties of the $Si_3N_4$ films obtained by the process of the present Example were evaluated in the same manner as in Example 1.

Results obtained are shown in Table 5.

Example 11

Example 10 was repeated to produce magneto-optical disks, except that $SiH_4$ gas and $N_2$ gas were mixed and the

What is claimed is:

1. A process for producing an optical recording medium comprising a resin substrate, an inorganic dielectric film formed on the resin substrate, the inorganic film being made of a reacted product of a material gas, and a recording layer containing at least one of a rare earth and a transition metal formed on the inorganic dielectric film, said process comprising steps of:

i) depositing the inorganic dielectric film on the substrate by:

a) providing a plasma processing device comprising a plasma chamber, a film forming chamber provided right beneath the plasma chamber, and microwave guide means provided with a microwave introducing portion and a ring waveguide which encircles the plasma chamber, wherein the waveguide has an inner wall and an outer wall between which an empty space is provided, the inner wall having a dividing block on the surface thereof so that microwaves introduced from the microwave introducing portion are divided, and the divided microwaves are propagated in two directions in the empty space to form interference waves in the empty space, and the inner wall having a plurality of slots each of which is provided so as to come in agreement with loops of the interference waves in the empty space;

b) disposing the resin substrate in the film forming chamber;

c) evacuating the plasma chamber and the film forming chamber, and then introducing a gas into the plasma chamber and introducing the material gas into the film forming chamber or the plasma chamber;

d) introducing into the waveguide the microwaves from the microwave introducing portion, forming interference waves in the empty space and then guiding the interference waves into the plasma chamber through the slots and forming a plasma of the gas in the plasma chamber; and e) reacting the plasma with the material gas to deposit the inorganic dielectric film on the substrate, wherein a temperature of the substrate during the step e) is not higher than 65° C., and the inorganic dielectric film is a material selected from a group consisting of $Si_3N_4$, SiC, SiO, $SiO_2$, a-Si, AlN, $Al_2O_3$, $TiO_2$, $Ta_2O_5$ and ZnS, and ii) depositing the recording layer on the inorganic dielectric film.

2. The process for producing an optical recording medium according to claim 1, wherein the plurality of the slots are provided at intervals corresponding to ½ of a wavelength of the microwaves introduced into the waveguide.

3. The process for producing an optical recording medium according to claim 1, wherein the microwave introducing portion is provided such that the microwaves are introduced in a direction of a center of the waveguide.

4. The process for producing an optical recording medium according to claim 1, wherein said waveguide is provided with a magnetic field generating means in a vicinity of said slots provided along a periphery of the inner wall thereof.

5. The process for producing an optical recording medium according to claim 1, wherein the recording film comprises an amorphous magnetic film.

6. The process for producing an optical recording medium according to claim 1, wherein the plasma chamber has a cavity rectangular in cross section.

7. The process for producing an optical recording medium according to claim 1, wherein the plasma chamber is cylindrical.

8. The process for producing an optical recording medium according to claim 1, further comprising the step of using the plasma processing device to form a second protective film on the recording film.

9. A process for producing an optical recording medium comprising a resin substrate, an inorganic dielectric film formed on the resin substrate, the inorganic film being made of a reacted product of a material gas, and a recording layer containing at least one of a rare earth and a transition metal formed on the inorganic dielectric film, said process comprising steps of:

i) depositing the inorganic dielectric film on the substrate by:
a) providing a plasma processing device comprising a plasma chamber, a film forming chamber provided right beneath the plasma chamber, and microwave guide means provided with a microwave introducing portion and a ring waveguide which encircles the plasma chamber, wherein the waveguide has an inner wall and an outer wall between which an empty space is provided, the inner wall having a dividing block on the surface thereof so that microwaves introduced from the microwave introducing portion are divided, and the divided microwaves are propagated in two directions in the empty space to form interference waves in the empty space, and the inner wall having a plurality of slots each of which is provided so as to come in agreement with loops of the interference waves in the empty space;
b) disposing the resin substrate in the film forming chamber;
c) evacuating the plasma chamber and the film forming chamber, and then introducing a gas into the plasma chamber and introducing the material gas into the film forming chamber or the plasma chamber;
d) introducing into the waveguide the microwaves from the microwave introducing portion, forming interference waves in the empty space and then guiding the interference waves into the plasma chamber through the slots and forming a plasma of the gas in the plasma chamber; and
e) reacting the plasma with the material gas to deposit the inorganic dielectric film on the substrate, and ii) depositing the recording layer on the inorganic dielectric film.

10. A process for producing an optical recording medium comprising a resin substrate, an inorganic dielectric film made of a-Si or SiC formed on the substrate, and a recording layer containing at least one of a rare earth and a transition metal formed on the inorganic dielectric film, comprising steps of:

i) depositing the inorganic dielectric film on the substrate by:
a) providing a plasma processing device comprising a plasma chamber and microwave guide means provided with a microwave introducing portion and a ring waveguide which encircles the plasma chamber, wherein the waveguide has an inner wall and an outer wall between which an empty space is provided, the inner wall having a dividing block on the surface thereof so that microwaves introduced from the microwave introducing portion are divided, and the divided microwaves are propagated in two directions of the empty space to form interference waves in the empty space, and the inner wall having a plurality of slots each of which is provided so as to come in agreement with loops of the interference wave in the empty space;
b) disposing the resin substrate in a film forming chamber;
c) evacuating the plasma chamber, and then introducing a starting material gas containing a Si atom into the plasma chamber; and
d) introducing into the waveguide the microwaves from the microwave introducing portion, forming interference waves in the empty space and then guiding the interference waves into the plasma chamber through the slots and forming a plasma of the gas in the plasma chamber, and ii) depositing the recording layer on the inorganic dielectric film.

11. The process according to claim 10, wherein a temperature of the substrate during the step i) e) is not higher than 65° C.

12. The process according to claim 10, wherein the material gas is selected from a group consisting of inorganic silane and organic silane.

13. The process according to claim 12, wherein the material gas is the inorganic silane, and the inorganic silane is selected from a group consisting of $SiH_4$ and $SiH_6$.

14. The process according to claim 12, wherein the material gas is the organic silane, and the organic silane is selected from a group consisting of tetraethylsilane, tetramethylsilane, and dimethylsilane.

15. The process according to claim 12, wherein the inorganic silane is halosilane selected from a group consisting of $SiF_4$, $Si_2F_6$, $SiHF_3$, $SiH_2F_2$, $SiCl_4$, $Si_2Cl_6$, $SiHCl_3$, $SiH_2Cl_2$, $SiH_3Cl$, and $SiCl_2F_2$.

16. The process according to claim 10, wherein the inorganic dielectric film is made of a-Si or SiC.

17. The process according to claim 1 or 9, wherein the inorganic dielectric film is a reacted product between the material gas and the gas introduced into the plasma chamber.

18. The process according to claim 17, wherein the material gas is selected from a group consisting of an inorganic silane and an organic silane, and the gas introduced into the plasma chamber is selected from a group consisting of $NH_3$, $N_2H_4$, hexamethyldisilazane, $O_2$, $O_3$, $H_2O$, NO, $N_2O$ and $NO_2$.

19. The process according to claim 17, wherein the material gas is selected from a group consisting of trimethylaluminum, triethylaluminum, triisobutylaluminum, dimethylaluminum hydride, $AlCl_3$, $TiCl_3$ and $TaCl_5$, and the gas introduced into the plasma chamber is selected from a group consisting of $NH_3$, $N_2H_4$, hexamethyldisilazane, $O_2$, $O_3$, $H_2O$, NO, $N_2O$, $N_2$ and $NO_2$.

* * * * *

UNITED STATES PATENT AND TRADEMARK OFFICE
CERTIFICATE OF CORRECTION

PATENT NO.    : 6,007,878
DATED         : December 28, 1999
INVENTOR(S)   : Takayuki Yagi It is certified that error appears in the above-identified patent and that said Letters Patent is hereby corrected as shown below:

Title page,
Item [56], References Cited, U.S. PATENT DOCUMENTS,
"Dandle" (both occurrence) should read -- Dandl --; and
FOREIGN PATENT DOCUMENTS:
"1223644" should read -- 1-223644 --; and
"3066043 3/1991 Japan ." should be deleted.

Column 2,
Line 38, "been not" should read -- not been --; and
Line 46, "carrier-to-noise" should read -- (carrier-to-noise) --.

Column 3,
Line 9, "includ-" should be deleted; and
Line 10, "ing" should be deleted.

Column 5,
Line 51, "microwave" should read -- microwaves --.

Column 8,
Line 45, "is" should read -- are --;
Line 62, "613" should read -- 614 --; and
Line 63, "614" should read -- 613 --.

Column 9,
Line 34, "SiH and $SiH_6$," should read -- $SiH_4$ and $Si_2H_6$, --;
Line 43, "$SiH_6$," should read -- $Si_2H_6$, --;
Line 57, "LTIBAI)" should read -- (TIBAI) --, and
Line 60, "$N_2O$ ," should read -- $N_2O$, --.

Column 11,
Line 33, "example" should read -- example, --.

Column 12,
Line 26, "microwaves" should read -- microwaves, --;
Line 28, "(twenty" should read -- (twenty- --; and
Line 56, "was" should read -- were --.

Column 14,
Line 13, "radius $\Upsilon$" should read -- radius $\Upsilon$ --;
Line 22, "stress $\upsilon$" should read -- stress $\sigma$ --; and

UNITED STATES PATENT AND TRADEMARK OFFICE
CERTIFICATE OF CORRECTION

PATENT NO. : 6,007,878
DATED : December 28, 1999
INVENTOR(S) : Takayuki Yagi

It is certified that error appears in the above-identified patent and that said Letters Patent is hereby corrected as shown below:

Column 15,
Line 53, "Stated-specifically," should read -- Stated specifically, --; and
Line 65, "-30 kg/mm" should read -- -30 kg/mm$^2$ --.

Column 17,
Line 7, "low" should read -- flow --.

Column 20,
Line 67, "532" should read -- 532 mm --.

Column 22,
Line 54, "in" should read -- into --.

Column 23,
Line 22, "film" should read -- layer --; and
Line 58, "in" should read -- into --.

Column 24,
Line 28, "in" should read -- into --;
Line 29, "wave" should read -- waves --;
Line 45, "e)" should be deleted; and
Line 52, "SiH$_6$." should read -- Si$_2$H$_6$. --.

Signed and Sealed this

Twenty-first Day of January, 2003

JAMES E. ROGAN
*Director of the United States Patent and Trademark Office*